(12) United States Patent
Togawa et al.

(10) Patent No.: US 11,597,051 B2
(45) Date of Patent: Mar. 7, 2023

(54) METHOD FOR POLISHING SUBSTRATE INCLUDING FUNCTIONAL CHIP

(71) Applicant: EBARA CORPORATION, Tokyo (JP)

(72) Inventors: Tetsuji Togawa, Tokyo (JP); Hiroshi Sobukawa, Tokyo (JP); Masahiro Hatakeyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 366 days.

(21) Appl. No.: 16/643,124

(22) PCT Filed: Aug. 22, 2018

(86) PCT No.: PCT/JP2018/030894
§ 371 (c)(1),
(2) Date: Feb. 28, 2020

(87) PCT Pub. No.: WO2019/049659
PCT Pub. Date: Mar. 14, 2019

(65) Prior Publication Data
US 2020/0391341 A1 Dec. 17, 2020

(30) Foreign Application Priority Data
Sep. 5, 2017 (JP) .............................. JP2017-170302

(51) Int. Cl.
*B24B 37/013* (2012.01)
*B24B 37/16* (2012.01)

(52) U.S. Cl.
CPC ............ *B24B 37/013* (2013.01); *B24B 37/16* (2013.01)

(58) Field of Classification Search
CPC ......... B24B 1/02; B24B 7/228; B24B 37/013; B24B 37/04; B24B 37/042; B24B 37/205;
(Continued)

(56) References Cited

U.S. PATENT DOCUMENTS 5,234,868 A * 8/1993 Cote .................... B24B 37/013
438/692
6,205,658 B1 3/2001 Kawano
(Continued)

FOREIGN PATENT DOCUMENTS

JP 2000-124601 A 4/2000
JP 3141939 B2 3/2001
(Continued)

OTHER PUBLICATIONS

International Patent Application No. PCT/JP2018/030894; Int'l Search Report; dated Nov. 6, 2018; 2 pages.

*Primary Examiner* — Joel D Crandall
*Assistant Examiner* — Robert F Neibaur
(74) *Attorney, Agent, or Firm* — BakerHostetler

(57) ABSTRACT

To terminate polishing at an appropriate position, an end point position of the polishing is sensed. According to one embodiment, a method that chemomechanically polishes a substrate including a functional chip is provided. The method includes: a step of disposing the functional chip on the substrate; a step of disposing an end point sensing element on the substrate; a step of sealing the substrate on which the functional chip and the end point sensing element are disposed with an insulating material; a step of polishing the insulating material; and a step of sensing an end point of the polishing based on the end point sensing element while the insulating material is polished.

11 Claims, 12 Drawing Sheets

(58) Field of Classification Search
CPC ....... B24B 37/005; B24B 37/16; B24B 37/20; B24B 49/04; B24B 49/10; B24B 49/12; B24B 49/16; B24B 53/017
USPC .......................................... 451/5, 6, 285, 548
See application file for complete search history.

(56) References Cited

U.S. PATENT DOCUMENTS

| | | |
|---|---|---|
| 2004/0119166 A1 | 6/2004 | Sunohara |
| 2005/0173259 A1* | 8/2005 | Mavliev .................. B23H 5/08 |
| | | 451/526 |
| 2005/0258522 A1* | 11/2005 | En .......................... H05K 3/067 |
| | | 257/670 |
| 2013/0109278 A1 | 5/2013 | Kimba |
| 2014/0185248 A1 | 7/2014 | Mizushiro |
| 2015/0258657 A1 | 9/2015 | Su et al. |

FOREIGN PATENT DOCUMENTS

| | | |
|---|---|---|
| JP | 2007-287803 A | 11/2007 |
| JP | 4056854 B2 | 3/2008 |
| JP | 2011-000647 A | 1/2011 |
| JP | 6005467 B2 | 10/2016 |
| KR | 2016-0089517 A | 7/2016 |
| WO | WO 2013/035655 A1 | 3/2013 |
| WO | WO 2015/080864 A1 | 6/2015 |

* cited by examiner

METHOD FOR POLISHING SUBSTRATE INCLUDING FUNCTIONAL CHIP

TECHNICAL FIELD

The present invention relates to a method for polishing a substrate including a functional chip.

BACKGROUND ART

To achieve downsizing and improved performance of electronics products, a three-dimensional mounting technology that piles up a plurality of semiconductor chips in multi-layer and produces one package has been gathering attention. There has been also invented a three-dimensional mounting technology that stacks thin-plated semiconductor chips having similar functions or thin-plated semiconductor chips having different functions for improved integration and achieves high-density mounting of the semiconductor chips by providing electrical connections between the respective semiconductor chips. There may be a case where an interposer and an interconnection chip are used in a package having a three-dimensional structure for electrical connection between the semiconductor chips. For formation of a three-dimensional wiring structure, there may be a case where a layer on which a semiconductor chip is disposed is sealed with an insulating material and a next wiring structure is formed on the insulating material.

CITATION LIST

Patent Literature

PTL 1: Japanese Unexamined Patent Application Publication No. 2007-287803

SUMMARY OF INVENTION

Technical Problem

As described above, to form the three-dimensional wiring structure including the embedded chip, there may be a case where the wiring structure is formed on the insulating material. Therefore, a surface of the insulating material needs to be flattened. A chemical mechanical polishing (CMP) to flatten the surface of the insulating material can be used. With the use of the CMP for polishing the insulating material, to terminate the polishing at an appropriate position, an end point position of the polishing needs to be sensed. Therefore, an object of the present invention is to provide a method for polishing an insulating material.

Solution to Problem

[Configuration 1]
According to the configuration 1, a method that chemo-mechanically polishes a substrate including a functional chip is provided. The method includes: a step of disposing the functional chip on the substrate; a step of disposing an end point sensing element on the substrate; a step of sealing the substrate on which the functional chip and the end point sensing element are disposed with an insulating material; a step of polishing the insulating material; and a step of sensing an end point of the polishing based on the end point sensing element while the insulating material is polished.

[Configuration 2]
According to the configuration 2, in the method according to the configuration 1, the end point sensing element includes a reflection element. The method includes: a step of irradiating the reflection element with light; and a step of receiving light reflected by the reflection element.

[Configuration 3]
According to the configuration 3, in the method according to the configuration 1 or the configuration 2, the method includes a step of fixing the end point sensing element to a top surface of the functional chip with an adhesive.

[Configuration 4]
According to the configuration 4, in the method according to any one of the configurations of the configuration 1 to the configuration 3, the end point sensing element includes a dummy element unrelated to a function configured on the substrate.

[Configuration 5]
According to the configuration 5, in the method according to any one of the configurations of the configuration 1 to the configuration 4, the method includes: a step of forming a metal layer on the insulating material; and a step of polishing the metal layer. When the metal layer is polished, the end point of the polishing is sensed based on at least one of: (1) a change in eddy current by an eddy current sensor; (2) a change in reflected light from the metal layer by an optical sensor; and (3) a change in polishing resistance.

[Configuration 6]
According to the configuration 6, in the method according to any one of the configurations of the configuration 1 to the configuration 4, the method includes: a step of forming a barrier mold layer on the insulating material; and a step of forming a metal layer on the barrier mold layer. When the metal layer is polished, the end point of the polishing is sensed based on at least one of: (1) a change in eddy current by an eddy current sensor; (2) a change in reflected light from the metal layer by an optical sensor; and (3) a change in polishing resistance.

[Configuration 7]
According to the configuration 7, in the method according to any one of the configurations of the configuration 1 to the configuration 6, the method includes: a step of performing a process for wiring on the insulating material after the insulating material is polished; and a step of performing a surface treatment to improve hydrophilicity on a processed surface of the insulating material.

[Configuration 8]
According to the configuration 8, a method for chemo-mechanically polishing a substrate including a functional chip is provided. The functional chip and an end point sensing element are disposed on the substrate, and the substrate is in a state of sealed with an insulating material. The method includes: a step of polishing the insulating material; and a step of sensing an end point of the polishing based on the end point sensing element while the insulating material is polished.

[Configuration 9]
According to the configuration 9, in the method according to the configuration 8, the end point sensing element includes a reflection element. The method includes: a step of irradiating the reflection element with light; and a step of receiving light reflected by the reflection element.

[Configuration 10]
According to the configuration 10, in the method according to the configuration 8 or the configuration 9, the end point sensing element is fixed to a top surface of the functional chip with an adhesive.

[Configuration 11]

According to the configuration 11, in the method according to any one of the configurations of the configuration 8 to the configuration 10, the end point sensing element includes a dummy element unrelated to a function configured on the substrate.

[Configuration 12]

According to the configuration 12, in the method according to any one of the configurations of the configuration 8 to the configuration 11, the substrate is in a state where a metal layer is formed on the insulating material. The method includes a step of polishing the metal layer. When the metal layer is polished, the end point of the polishing is sensed based on at least one of: (1) a change in eddy current by an eddy current sensor; (2) a change in reflected light from the metal layer by an optical sensor; and (3) a change in polishing resistance.

[Configuration 13]

According to the configuration 13, in the method according to any one of the configurations of the configuration 8 to the configuration 11, the substrate is in a state where a barrier mold layer is formed on the insulating material and further a metal layer is formed on the barrier mold layer. When the metal layer is polished, the end point of the polishing is sensed based on at least one of: (1) a change in eddy current by an eddy current sensor; (2) a change in reflected light from the metal layer by an optical sensor; and (3) a change in polishing resistance.

[Configuration 14]

According to the configuration 14, a method for chemomechanically polishing a substrate including a functional chip sealed with an insulating material is provided. The method includes: a step of irradiating a top surface of the functional chip with light through the insulating material; a step of receiving light reflected by the top surface of the functional chip; and a step of determining an end point of the polishing of the substrate based on a change in the received light.

[Configuration 15]

According to the configuration 15, in the method according to the configuration 14, the method further includes: a step of dispersing the light reflected by the top surface of the functional chip; and a step of determining the end point of the polishing of the substrate based on a change in relative reflectance of each wavelength of the light reflected by the top surface of the functional chip.

[Configuration 16]

According to the configuration 16, in the method according to the configuration 15, the light to be irradiated has a wavelength of a visible light area or an infrared light area.

[Configuration 17]

According to the configuration 17, in the method according to the configuration 14, the method includes a step of determining the end point of the polishing of the substrate based on a change in intensity of the received light.

[Configuration 18]

According to the configuration 18, a method for chemomechanically polishing a substrate including a functional chip sealed with an insulating material is provided. The method includes: a step of irradiating the substrate with light such that the light is totally reflected by a surface of the substrate; a step of receiving light totally reflected by the surface of the substrate; and a step of determining an end point of the polishing of the substrate based on a change in the received light.

[Configuration 19]

According to the configuration 19, a computer-readable recording medium that records a program is provided. When the program is executed by a control device to control an operation of a substrate polishing apparatus, the program causing the control device to control the substrate polishing apparatus and to execute the method according to any one of the configurations of the configuration 1 to the configuration 18.

[Configuration 20]

According to the configuration 20, a program that causes a control device including a computer to execute the method according to any one of the configurations of the configuration 1 to the configuration 18 is provided.

[Configuration 21]

According to the configuration 21, a substrate is provided. The substrate includes a functional chip, an insulating material, and an end point sensing element. The insulating material covers the functional chip.

[Configuration 22]

According to the configuration 22, in the substrate according to the configuration 21, the end point sensing element includes a reflection element.

[Configuration 23]

According to the configuration 23, in the substrate according to the configuration 20 or the configuration 21, the end point sensing element is fixed to a top surface of the functional chip with an adhesive.

[Configuration 24]

According to the configuration 24, in the substrate according to any one of the configurations of the configuration 21 to the configuration 23, the end point sensing element includes a dummy element unrelated to a function configured on the substrate.

[Configuration 25]

According to the configuration 25, in the substrate according to any one of the configurations of the configuration 21 to the configuration 24, a metal layer is formed on the insulating material.

[Configuration 26]

According to the configuration 26, in the substrate according to any one of the configurations of the configuration 21 to the configuration 24, a barrier mold layer is formed on the insulating material, and a metal layer is further formed on the barrier mold layer.

DESCRIPTION OF EMBODIMENTS

Figure 1:
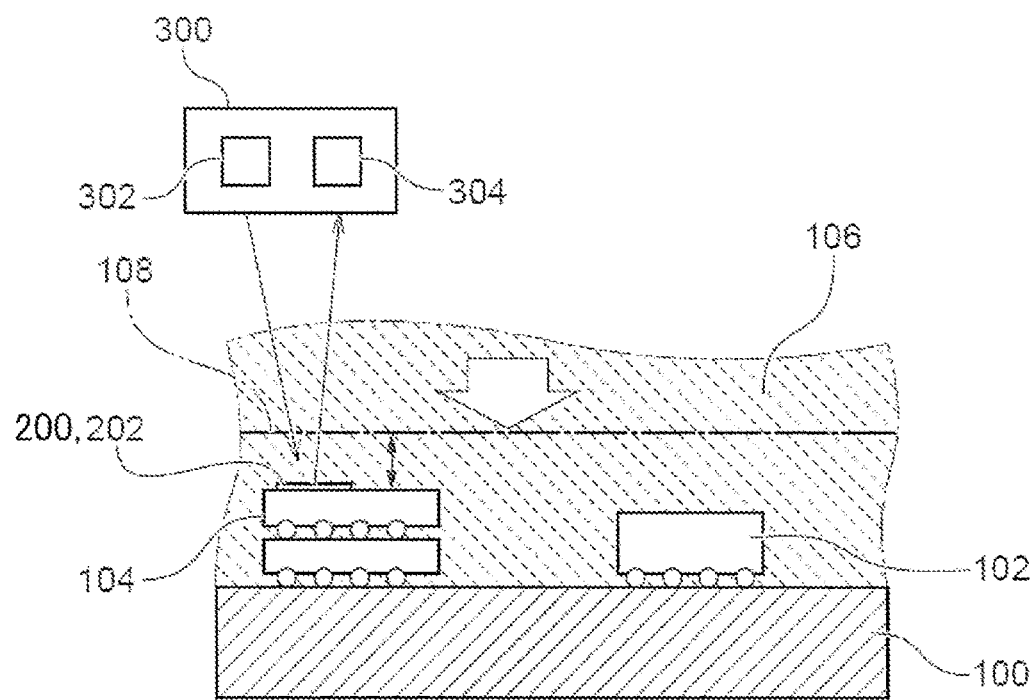
FIG. 1 is a drawing describing a method for polishing a substrate according to one embodiment.

The following describes embodiments of a method for polishing a substrate including a functional chip according to the present invention with reference to the attached drawings. In the attached drawings, identical or similar reference numerals are given to identical or similar components, and overlapping description regarding the identical or similar components may be omitted in the description of the respective embodiments. Features shown in the respective embodiments are applicable to other embodiments in so far as they are consistent with one another.

FIG. 1 is a drawing describing the method for polishing the substrate according to one embodiment. In the embodiment illustrated in FIG. 1, in a substrate, a logic chip 102, such as a CPU and a GPU, and/or a memory chip 104, and the like are disposed on a Copper Clad Laminate (CCL) base 100. In this specification, chips including predetermined functions, such as the logic chip and the memory chip, will be referred to as functional chips. In the embodiment illustrated in FIG. 1, among the functional chips 102 and 104, an end point sensing element 200 is disposed on a surface on an upper side of the functional chip at the highest position from a surface of the CCL base 100. In the embodiment of FIG. 1, the end point sensing element 200 is a reflective film 202 disposed on the memory chip 104. The reflective film 202 can be, for example, a coating of a metal film applied on a top surface of the functional chip. After disposing the functional chips 102 and 104 and the end point sensing element 200 on the CCL base 100, the CCL base 100 on which the functional chips 102 and 104 are mounted is sealed with an insulating material 106. The insulating material 106 can be, for example, resin and a glass material. After the sealing with the insulating material 106, the insulating material 106 is polished such that the insulating material 106 becomes flat. Thereafter, fine lateral wiring and/or longitudinal wiring is performed on the insulating material 106; therefore, polishing the insulating material 106 to be flat is important. The polishing of the insulating material 106 can be chemomechanically polished (CMP). The CMP can use a general CMP apparatus. Any CMP apparatus can be used, and, for example, the known CMP apparatus may be used. When the insulating material 106 is polished by CMP, an end point of the polishing can be sensed using the end point sensing element 200. In the embodiment of FIG. 1, since the end point sensing element 200 is the reflective film 202, the end point sensing can be optically performed. For example, a CMP apparatus 300 includes a light source 302 to irradiate the reflective film 202 with light, such as a laser, and includes a sensor 304 to receive reflected light from the reflective film 202. A distance from the reflective film 202 is measured with the reflected light from the reflective film 202, the polishing is performed up to a polishing target position 108, and the polishing is terminated. An end point position of the insulating material 106 is preferably, for example, ±10 µm or less from the polishing target position 108. The polishing target position 108 can be set to, for example, 10 µm to 500 µm from the top surface of the chip at the uppermost position where the reflective film 202 is disposed.

While the reflective film 202 is used as the end point sensing element 200 in the above-described embodiment illustrated in FIG. 1, as another embodiment, a fluorescent material, resin containing a fluorescent material, or the like can be used instead of the reflective film 202. The fluorescent material or the resin containing the fluorescent material may be applied over only the surface on the upper side of the functional chip at the highest position from the surface of the CCL base 100 as illustrated in FIG. 1. Alternatively, after disposing the functional chips 102 and 104 on the CCL base 100, the fluorescent material or the resin may be applied over the whole surface of the substrate. In the case where the fluorescent material or the resin containing the fluorescent material is applied over the surface on the upper side of the functional chip 102 or 104, the fluorescent material or the resin may be applied over only a part of the surface or may be applied over the whole surface. After the application of the fluorescent material, the whole substrate is sealed with the insulating material 106. In such an embodiment, the light source 302 selects a light having a wavelength causing the fluorescent material to generate fluorescent light. The sensor 304 measures intensity of the fluorescent light from the fluorescent material applied over the top surface of the functional chip at the highest position. The intensity of the fluorescent light changes depending on a thickness of the insulating material 106 disposed on the fluorescent material. Therefore, the thickness of the insulating material 106 can be detected from the detected intensity of the fluorescent light, and the end point of the polishing of the insulating material 106 can be sensed. Note that a wavelength filter can be used to detect only the fluorescent wavelength by the sensor 304. Alternatively, the intensity of the fluorescent wavelength may be detected using a spectroscope.

Figure 2:
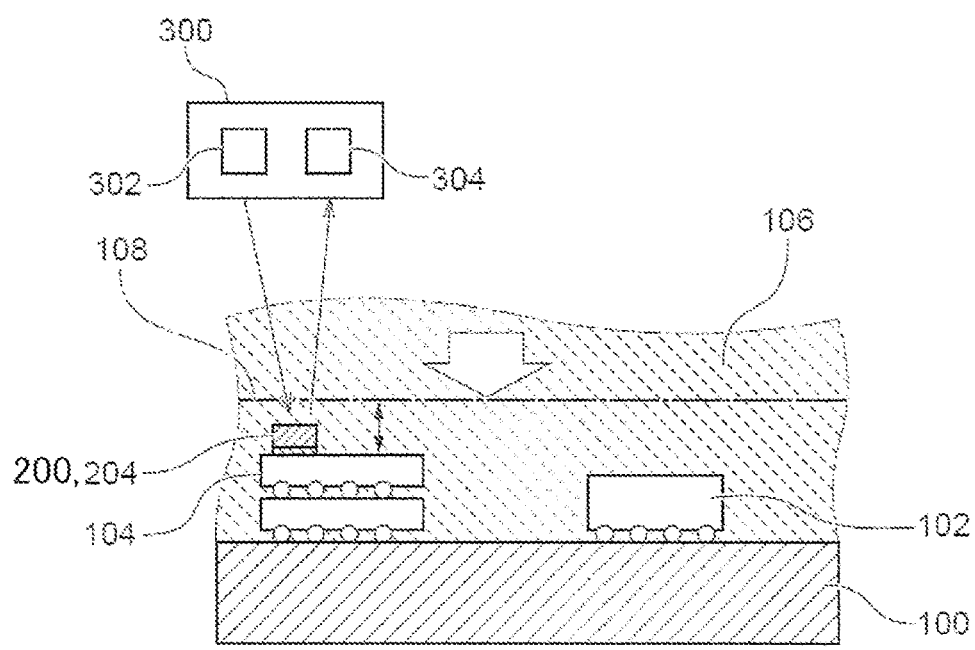
FIG. 2 is a drawing describing the method for polishing the substrate according to one embodiment.

FIG. 2 is a drawing describing the method for polishing the substrate according to one embodiment. In the embodiment of FIG. 2, a reflective plate 204 as the end point sensing element 200 is fixed to the surface on the upper side of the functional chip 102 or 104 at the highest position from the surface of the CCL base 100 among the functional chips 102 and 104. The reflective plate 204 can be fixed to the top surface of the functional chip 102 or 104 using, for example, an adhesive. For example, a plate-shaped member on which metal coating is applied can be used as the reflective plate 204. Except for the reflective plate 204, this embodiment can be configured similar to the embodiment illustrated in FIG. 1.

Figure 3:
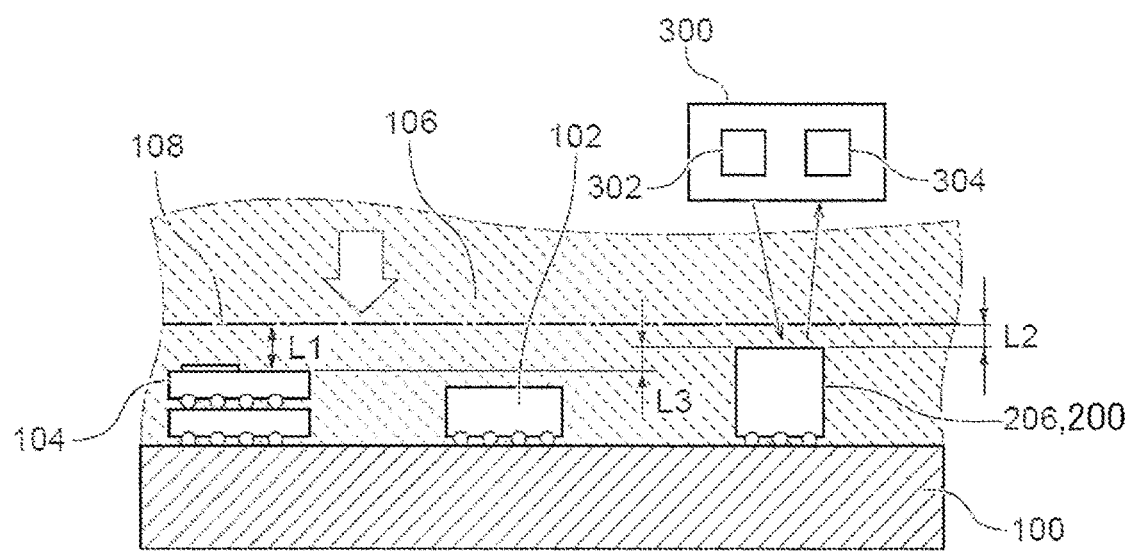
FIG. 3 is a drawing describing the method for polishing the substrate according to one embodiment.

FIG. 3 is a drawing describing the method for polishing the substrate according to one embodiment. In the embodiment illustrated in FIG. 3, in the substrate, the logic chip 102, such as a CPU and a GPU, and/or the memory chip 104, and the like are disposed on the Copper Clad Laminate (CCL) base 100. In the embodiment illustrated in FIG. 3, separately from the functional chips 102 and 104, a dummy element 206 unrelated to a function of a device formed on the substrate is disposed as the end point sensing element 200. The dummy element 206 is disposed such that a top surface of the dummy element 206 is disposed at a position higher than the top surface of the functional chip at the highest position from the surface of the CCL base 100. The top surface of the dummy element 206 may be configured as the reflective film 202 as in the embodiment of FIG. 1, or the reflective plate 204 as in the embodiment of FIG. 2 may be mounted to the top surface of the dummy element 206. The dummy element 206 can be mounted to the CCL base 100 with an adhesive. Alternatively, the dummy element 206 may be adhered with a bump similarly to the other functional chips 102 and 104. The adhesion with the bump in a step identical to that of the other functional chips 102 and 104 allows a decrease in mounting error of the functional chips 102 and 114 with the dummy element 206. Although the dummy element 206 can be disposed at any position, the dummy element 206 needs to be disposed at a position where the dummy element 206 does not hinder the other functional chips. A plurality of the dummy elements 206 may be disposed. After the functional chips 102 and 104 and the dummy element 206 are disposed on the CCL base 100, the CCL base 100 on which the functional chips 102 and 104 and the dummy element 206 are mounted is sealed with the insulating material 106. The insulating material 106 can be, for example, resin and a glass material. After the sealing with the insulating material 106, the insulating material 106 is polished such that the insulating material 106 becomes flat. The polishing of the insulating material 106 can be chemomechanically polished (CMP). The CMP can use a general CMP apparatus. Any CMP apparatus can be used, and, for example, the known CMP apparatus may be used. When the insulating material 106 is polished by CMP, an end point of the polishing can be sensed using the dummy element 206 as the end point sensing element 200. In the embodiment of FIG. 3, since the top surface of the dummy element 206 is the reflective film 202 or the reflective plate 204, the end point sensing can be optically performed as described above. As the polishing target position 108, for example, as illustrated in FIG. 3, a distance L1 from the top surface of the functional chip at the highest position from the surface of the CCL base 100 is determined. A height difference L3 between the top surface of the functional chip at the highest position from the surface of the CCL base 100 and the top surface of the dummy element 206 is preliminarily measured. The height difference L3 can be measured with any position sensor, a confocal microscope, or the like after disposing the functional chips 102 and 104 and the dummy element 206 on the CCL base 100 and before molding with the insulating material 106. A distance L2 between the top surface of the dummy element 206 and the polishing target position 108 is calculated such that the polishing target position 108 becomes L1. When the insulating material 106 is polished, polishing the insulating material 106 until a distance from the top surface of the dummy element 206 to the surface of the insulating material 106 becomes L2 ensures polishing the insulating material 106 up to the polishing target position 108. The polishing target position 108 as the end point can be set to, for example, 10 µm to 500 µm from the top surface of the chip at the uppermost position where the reflective film 202 is disposed.

Figure 4:
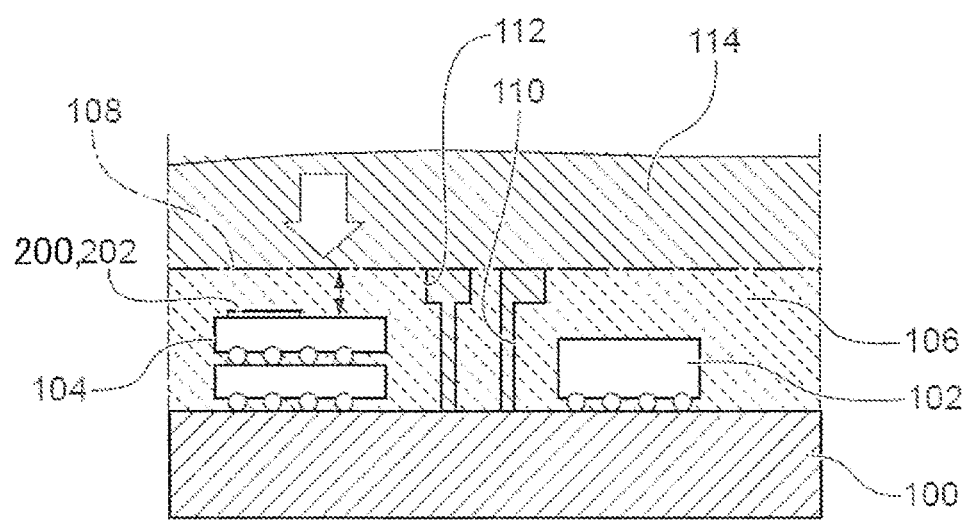
FIG. 4 is a drawing describing the method for polishing the substrate according to one embodiment.

FIG. 4 is a drawing describing the method for polishing the substrate according to one embodiment. FIG. 4 illustrates a method when a wiring layer is formed on the flattened insulating material 106 and the wiring layer is polished. In the embodiment illustrated in FIG. 4, the insulating material 106 is polished up to the polishing target position 108 by the method similar to the methods of the embodiments illustrated in FIG. 1 to FIG. 3. In the embodiment illustrated in FIG. 4, a pattern for wiring is formed on the flattened insulating material 106 afterwards. As the pattern for wiring, formation of a via 110 for longitudinal wiring, formation of a pattern 112 for lateral wiring, and the like are performed by exposure, etching, and the like. Then, for example, a metal layer 114, such as copper, is formed on the pattern-formed insulating material 106 (the state illustrated in FIG. 4). Afterwards, an unnecessary part of the metal layer 114 is removed through polishing. The polishing of the metal layer 114 can be performed by CMP. It is important that a metal does not remain on the polished surface after the metal layer 114 is polished in the polishing of the metal layer 114. The presence of the residual metal on the surface of after polishing possibly generates a leak current or causes deterioration of the element. Therefore, regarding the polishing target position 108, the polishing target position 108 can be determined such that the metal layer 114 is removed and a part of the insulating material 106 is polished. For example, the polishing target position 108 can be set to the insulating material 106 side by about 5 µm to 10 µm from a boundary surface between the metal layer 114 and a layer of the insulating material 106. When the metal layer 114 is polished by CMP, the end point sensing of the polishing can be performed through observation of a change in eddy current by an eddy current sensor, which detects an eddy current occurred in the metal layer 114. Alternatively, the end point sensing may be performed through observation of a change in reflected light from the metal layer 114 by an optical sensor. Alternatively, the end point sensing can be performed through observation of a change in polishing resistance generated at a part where the material changes from the metal layer 114 to the insulating material 106 or a change in torque of a driving mechanism of the CMP apparatus. Note that, to avoid generating the residual metal on the surface after polishing, after sensing the boundary of the layers due to the change in layer by polishing, the polishing may be performed for a predetermined period for polishing up to the above-described polishing target position 108. Besides, the known end point sensing may be employed.

Figure 5:
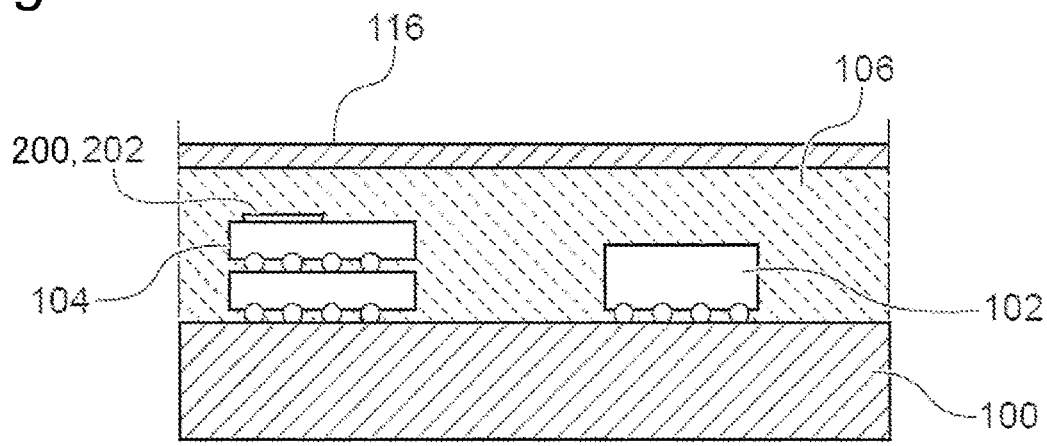
FIG. 5 includes drawings describing the method for polishing the substrate according to one embodiment.
Figure 5:
Figure 5:
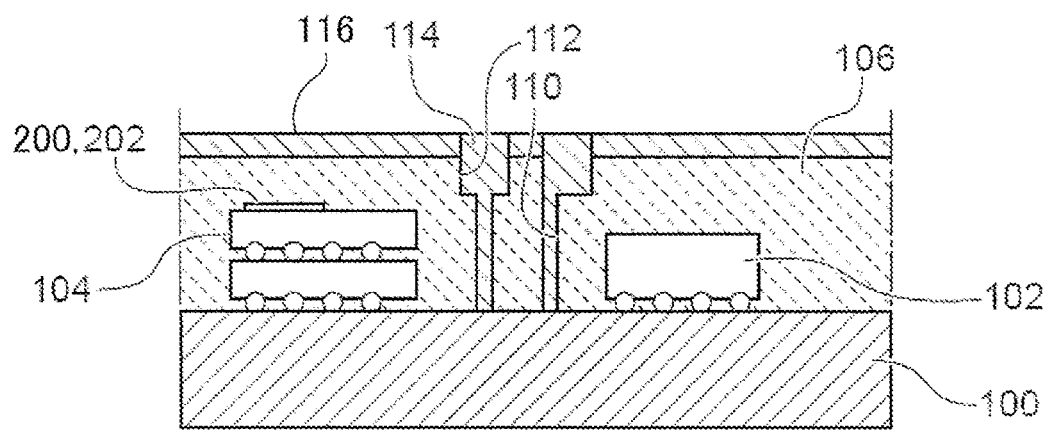

FIG. 5 includes drawings describing the method for polishing the substrate according to one embodiment. In the embodiment illustrated in FIG. 5, the insulating material 106 is polished up to the polishing target position 108 by the method similar to the methods of the embodiments illustrated in FIG. 1 to FIG. 3. In the embodiment illustrated in FIG. 5, a barrier mold layer 116 is subsequently formed on the flattened insulating material 106 (the state of the drawing on the upper side in FIG. 5). The barrier mold layer 116 is made of an insulating material. A material having a weight density different from that of the insulating material 106 below the barrier mold layer 116 is used for the barrier mold layer 116 such that a friction force during polishing becomes different between the barrier mold layer 116 and the insulating material 106. Additionally, the barrier mold layer 116 can be formed as a layer thinner than the layer of the insulating material 106. For example, the barrier mold layer 116 can be formed so as to have a thickness around 10 nm to 10 μm. After forming the barrier mold layer 116, a pattern for wiring on the barrier mold layer 116 is formed. As the pattern for wiring, formation of the via 110 for longitudinal wiring, formation of the pattern 112 for lateral wiring, and the like are performed by exposure, etching, and the like. Then, for example, the metal layer 114, such as copper, is formed on the pattern-formed insulating material 106. Afterwards, an unnecessary part of the metal layer 114 is removed through polishing. The drawing on the lower side in FIG. 5 illustrates a state of removing the metal layer 114. The polishing of the metal layer 114 can be performed by CMP. In the polishing of the metal layer 114 by CMP, when the metal layer 114 is removed and the barrier mold layer 116 is exposed, a polishing resistance changes. Therefore, the change in polishing resistance can be used for the end point sensing of polishing to remove the metal layer 114 by CMP. Additionally, when excessive polishing removes the barrier mold layer 116, the insulating material 106, which is disposed further below the barrier mold layer 116, is exposed, and thus the polishing resistance changes further. Therefore, the excessive polishing can be sensed from the change in polishing resistance at the change from the barrier mold layer 116 to the insulating material 106.

Figure 6:
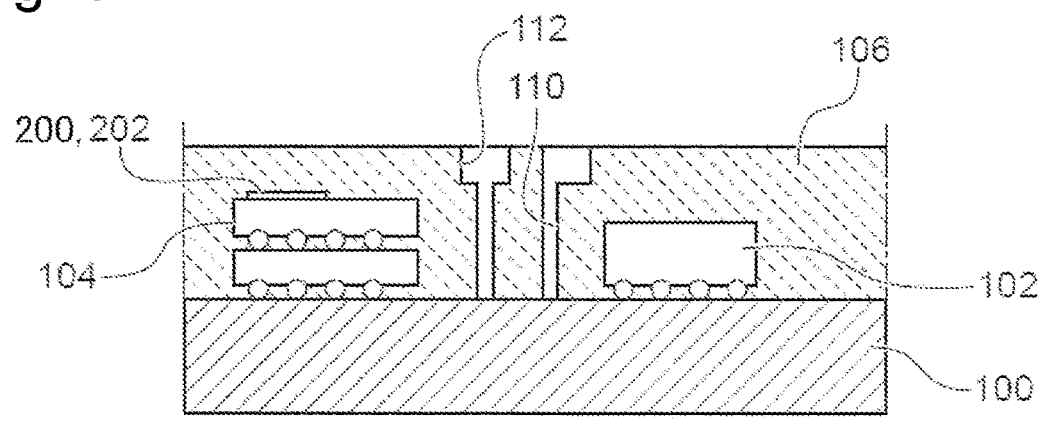
FIG. 6 is a drawing describing the method for polishing the substrate according to one embodiment.

FIG. 6 is a drawing describing the method for polishing the substrate according to one embodiment. In the embodiment illustrated in FIG. 5, the insulating material 106 is polished up to the polishing target position 108 by the method similar to the methods of the embodiments illustrated in FIG. 1 to FIG. 3. In the embodiment illustrated in FIG. 6, a pattern for wiring is formed on the flattened insulating material 106 afterwards. As the pattern for wiring, formation of the via 110 for longitudinal wiring, formation of the pattern 112 for lateral wiring, and the like are performed by exposure, etching, and the like (the state of FIG. 6). Afterwards, exposure of light and laser improves hydrophilicity of the surface of the insulating material 106. This process ensures improving close contact of the metal layer 114 as a conductive material performed thereafter. The formation of the metal layer 114 and the like subsequent to this can be performed similarly to the embodiment described in FIG. 4. The process of improving hydrophilicity may be added to the embodiment described in FIG. 5 or other embodiments.

Figure 7:
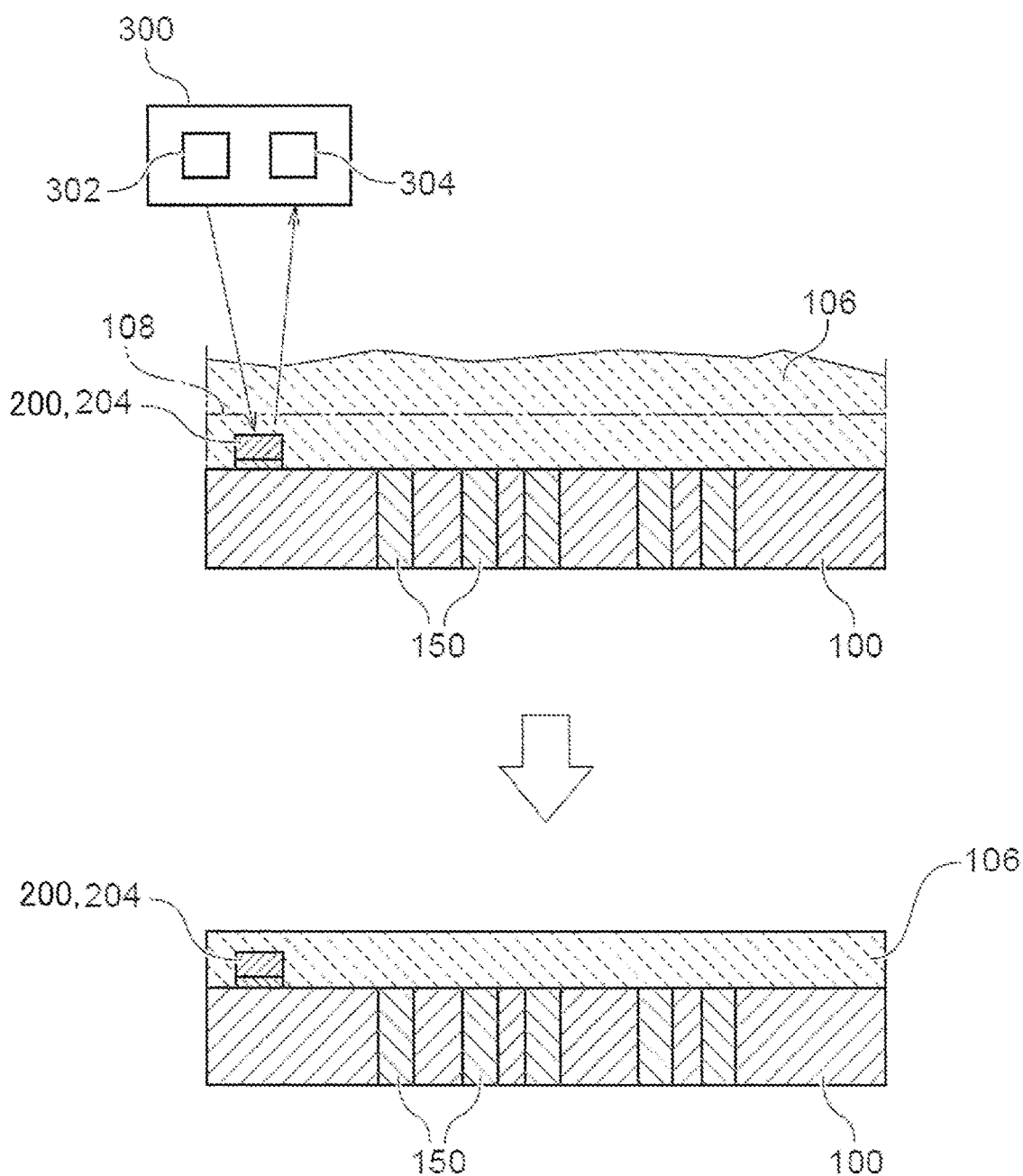
FIG. 7 includes drawings describing the method for polishing the substrate according to one embodiment.

FIG. 7 includes drawings describing the method for polishing the substrate according to one embodiment. In the embodiment of FIG. 7, the substrate includes the Copper Clad Laminate (CCL) base 100 including a penetration wiring 150. The CCL base 100 including the penetration wiring 150 is flattened by, for example, CMP. The end point sensing element 200 is disposed on the flattened top surface of the CCL base 100. In the embodiment of FIG. 7, the end point sensing element 200 is the reflective plate 204. The reflective plate 204 can be fixed on the CCL base 100 using, for example, an adhesive. Afterwards, the CCL base 100 on which the reflective plate 204 is disposed is sealed with the insulating material 106. The insulating material 106 can be, for example, resin and a glass material as already described. After the sealing with the insulating material 106, the insulating material 106 is polished such that the insulating material 106 becomes flat. The end point sensing of the polishing of the insulating material 106 can be performed by detection of the reflected light of the light or the laser by the sensor as already described in FIGS. 1, 2, and the like. Although the reflective plate 204 can be disposed at any position in the embodiment of FIG. 7, the reflective plate 204 needs to be disposed at a position where the reflective plate 204 does not hinder the other functional chips and the like. A plurality of the reflective plates 204 may be disposed. In the embodiment of FIG. 7, instead of the reflective plate 204, the dummy element 206 illustrated in FIG. 3 may be disposed.

Figure 8:
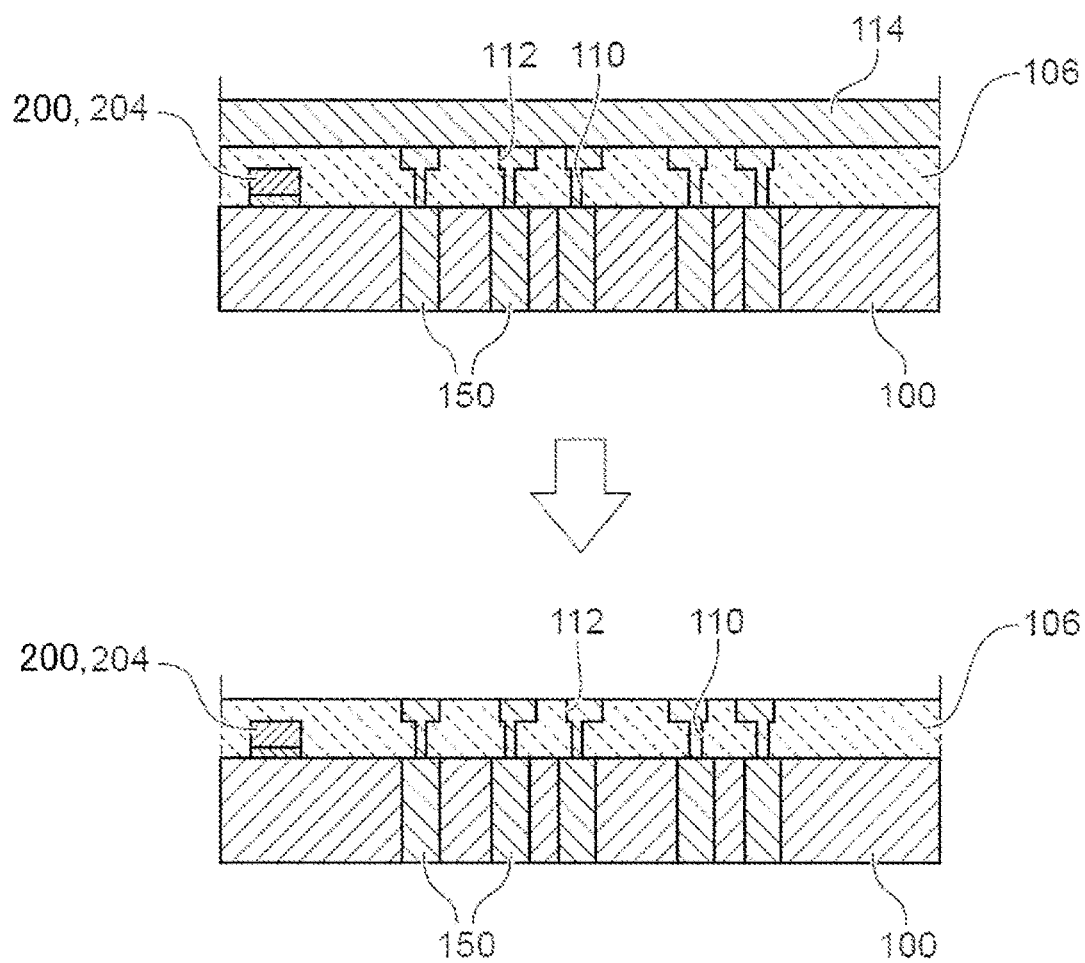
FIG. 8 includes drawings describing the method for polishing the substrate according to one embodiment.

FIG. 8 includes drawings describing the method for polishing the substrate according to one embodiment. FIG. 8 illustrates a method when a wiring layer is formed on the flattened insulating material 106 and the wiring layer is polished. In the embodiment illustrated in FIG. 8, the insulating material 106 is polished up to the polishing target position 108 by the method similar to the method of the embodiment illustrated in FIG. 7. In the embodiment illustrated in FIG. 8, a pattern for wiring is formed on the flattened insulating material 106 afterwards. As the pattern for wiring, formation of the via 110 for longitudinal wiring, formation of the pattern 112 for lateral wiring, and the like are performed by exposure, etching, and the like. Then, for example, the metal layer 114, a conductive material such as copper, is formed on the pattern-formed insulating material 106 (the state illustrated in the drawing on the upper side in FIG. 8). Afterwards, an unnecessary part of the metal layer 114 is removed through polishing. The polishing of the metal layer 114 can be performed by CMP. The polishing of the metal layer 114 can be performed similarly to the polishing described in the embodiment of FIG. 4.

Figure 9:
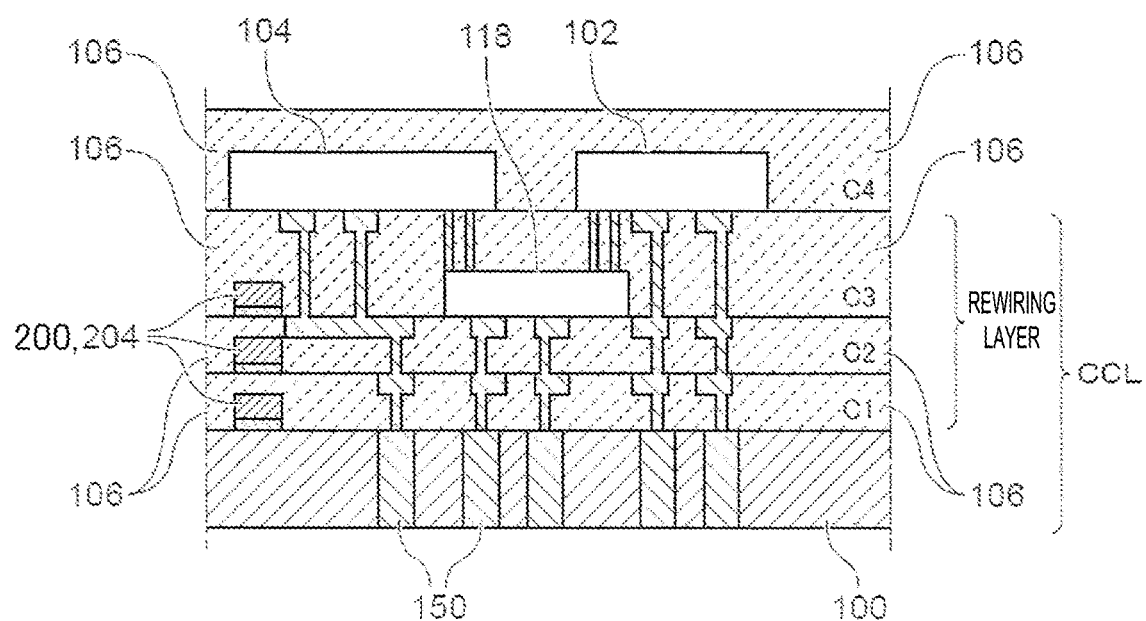
FIG. 9 is a drawing describing the method for polishing the substrate according to one embodiment.
Figure 10:
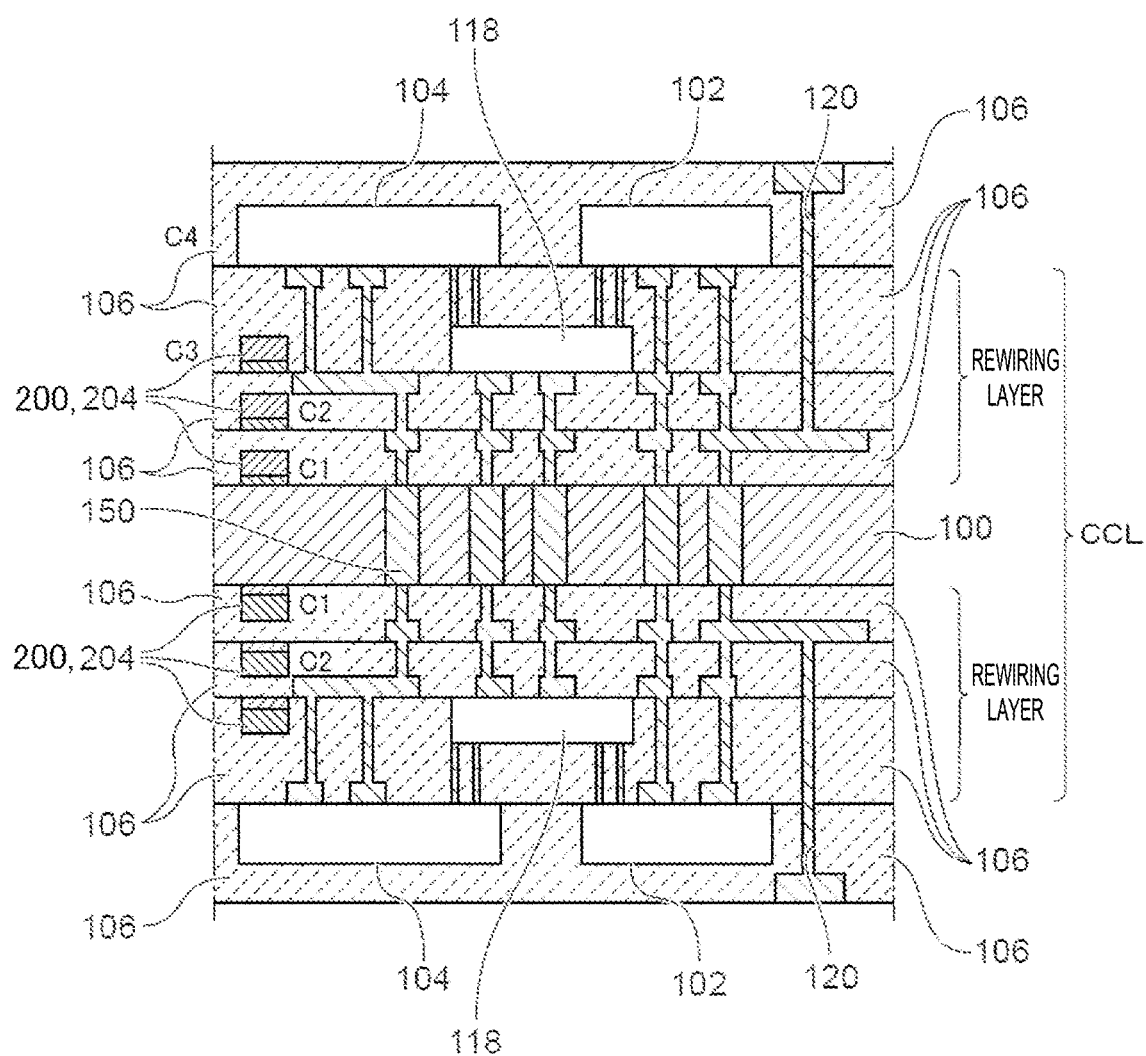
FIG. 10 is a drawing describing the method for polishing the substrate according to one embodiment.

FIG. 9 is a drawing describing the method for polishing the substrate according to one embodiment. FIG. 9 illustrates a method when layers of a plurality of the insulating materials 106 including wiring layers are formed. A first layer C1 of the insulating material 106 formed on the CCL base 100 can be formed by the method similar to the embodiment illustrated in FIG. 8. Afterwards, the reflective plate 204 is fixed to the flattened top surface of the first layer C1. The reflective plate 204 can be fixed to the top surface of the first layer C1 using, for example, an adhesive. Afterwards, the insulating material 106 is formed, and, as described in FIG. 8, further the pattern for wiring is formed, the metal layer 114 is formed, and the metal layer 114 is polished, thus forming a second layer C2. A third layer C3 can be similarly formed. The number of layers of the insulating materials 106 including the wiring layers can be formed by any given number. In the embodiment illustrated in FIG. 9, the functional chips, such as the logic chip 102 and the memory chip 104, are disposed on the third layer C3. As illustrated in FIG. 9, a wiring between these functional chips may be performed with an interconnection chip 118 and an interposer. Although FIG. 9 illustrates an example of mounting the wiring and the functional chips only on one side surface of the CCL base 100, as another embodiment, the wirings and the functional chips may be mounted on both surfaces of the CCL base 100. Moreover, a longitudinal wiring for taking out the wiring from the interposer and the interconnection chip 118 to outside a package mold may be formed. The longitudinal wiring can be formed by any method, and, for example, can be performed by the methods disclosed in this specification. FIG. 10 illustrates an example of mounting the wirings and the functional chips on both surfaces of the CCL base 100 and includes longitudinal wirings 120 for taking out the wirings from the interconnection chips 118 to outside the package mold. The package illustrated in FIG. 10 can be formed by a combination of the methods disclosed in this specification.

Figure 11:
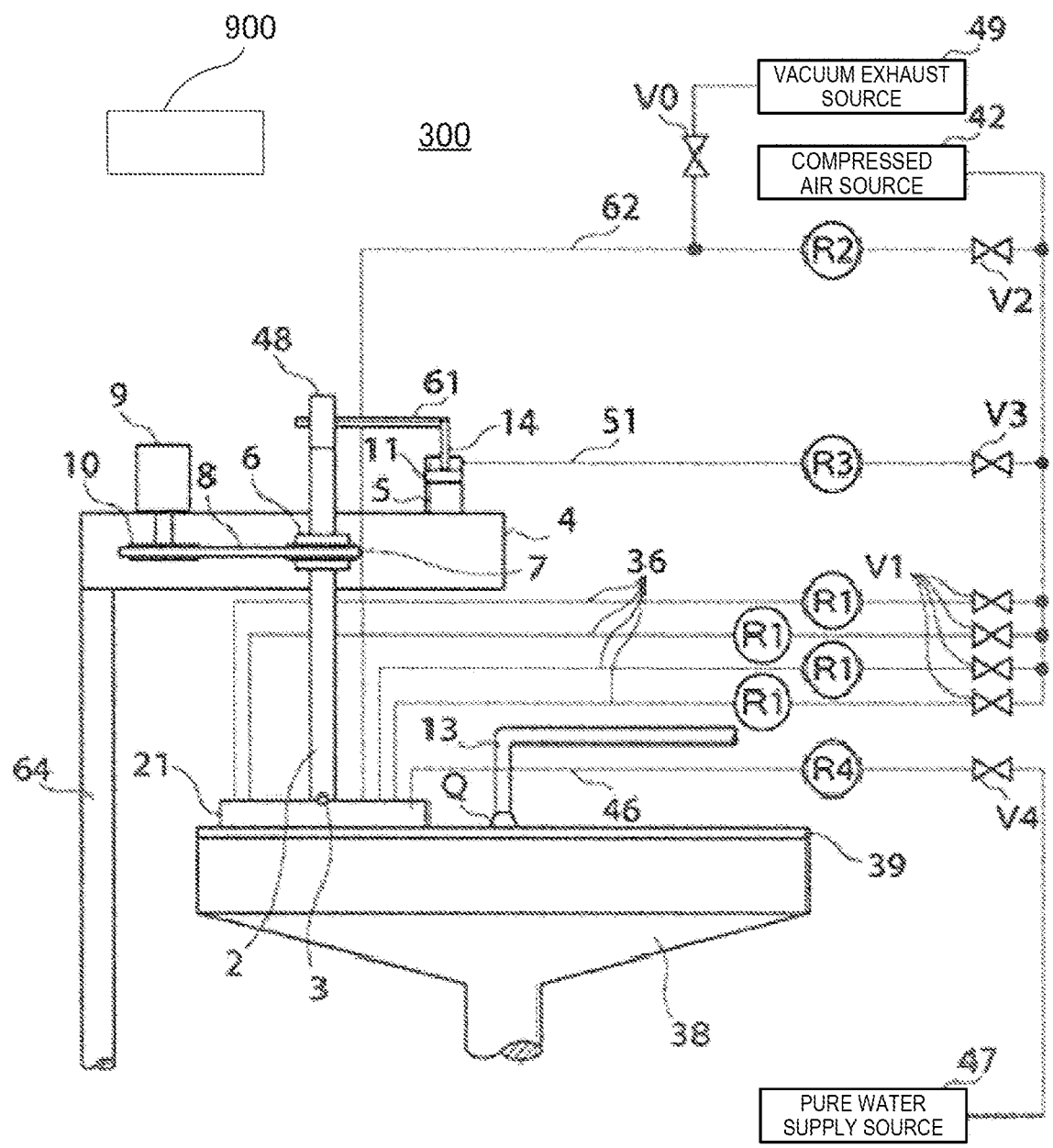
FIG. 11 is a conceptual diagram illustrating a configuration of a CMP apparatus according to one embodiment.

FIG. 11 is a conceptual diagram illustrating a configuration of the CMP apparatus 300 according to one embodiment. The CMP apparatus 300 includes a substrate holding head 21, a bearing ball 3, a head shaft 2, a polishing plate 38, a polishing cloth 39, a first air supply line 36, a second air supply line 62, a first air regulator R1, a second air regulator R2, a pure water supply line 46, and a pure water regulator R4. The polishing device 1 further includes a head fixing member 4, a connecting shaft 48, an air cylinder 5, a piston 14, a third air supply line 51, a third air regulator R3, a rotation pipe 6, a timing pulley 7, a timing belt 8, a timing pulley 10, a motor 9, an abrasive liquid supply nozzle 13, and the like.

The substrate holding head 21 is engaged with the head shaft 2 via the bearing ball 3. The head shaft 2 is engaged with the head fixing member 4 via a bearing (not illustrated) to be movable up and down and rotatably, and connected to the piston 14 in the air cylinder 5 via a connecting shaft 48 and a connecting rod 61. The air cylinder 5 is connected to the third air supply line 51. The third air supply line 51 is connected to a compressed air source 42 via a third valve V3 and a third air regulator R3. A pressure of the air cylinder 5 is regulated to be a predetermined pressure by the third air regulator R3.

The pressure of the air cylinder 5 causes the piston 14 to move up and down, the up-down movement of the piston 14 causes the connecting shaft 48 and the substrate holding head shaft 2 to move up and down via the connecting rod 61 to separate a substrate W held to a lower surface of the substrate holding head 21 from the polishing plate 38 or push the substrate W to the polishing plate 38. Furthermore, a top surface of the substrate holding head 21 and a lower end surface of the head shaft 2 form a ball bearing housing the bearing ball 3. The substrate holding head 21 is tiltable around the bearing ball 3 with respect to the polishing plate 38 or the polishing cloth 39 via the bearing ball 3. Note that the bearing ball 3 is positioned at the center of the head shaft 2.

The rotation pipe 6 is mounted to the head shaft 2, and the rotation pipe 6 includes the timing pulley 7 on its outer periphery. The timing pulley 7 is connected to the timing pulley 10 disposed on the motor 9 fixed to the head fixing member 4 (also referred to as an arm) via the timing belt 8. Accordingly, by rotatably driving the motor 9, the rotation pipe 6 and the head shaft 2 are integrally rotated via the timing belt 8 and the timing pulley 7, and the rotation of the head shaft 2 rotates the substrate holding head 21. The head fixing member 4 has one end swingably supported by a swing shaft 64. The rotation from the head shaft 2 is not transmitted to the connecting shaft 48.

The CMP apparatus 300 includes a control device 900, and various sensors and an operation mechanism disposed in the CMP apparatus 300 can be controlled by the control device 900. The control device 900 can include a general computer including an input/output device, an arithmetic device, a storage device, and the like. A computer program to operate the methods described in this specification is installed on the control device 900. This computer program may be stored in a non-volatile recording medium, and the program may be delivered to the computer by various communications technologies.

In the CMP apparatus 300 illustrated in FIG. 11, the substrate to be polished is held to the lower surface of the substrate holding head 21 by vacuum suction. As illustrated in FIG. 11, the polishing plate 38 is disposed on the lower side in the vertical direction of the substrate holding head 21. The polishing cloth 39 is pasted to the top surface of the polishing plate 38. The polishing cloth 39 is configured so as to be in contact with a polished surface of the substrate. In the polishing cloth 39, the surface in contact with the polished surface of the substrate W is the polished surface.

As illustrated in FIG. 11, the substrate holding head 21 is connected to the air supply line 62. The air supply line 62 is connected to the compressed air source 42 via a valve V2 and the air regulator R2, and connected to a vacuum exhaust source 49 via a valve V0. In a state where the valve V0 is closed and the second valve V2 is opened, a desired pressure can be given to a back surface of the substrate (a surface on the side opposite to the polished surface) held to the substrate holding head 21, and this pressure pushes the substrate to the polishing plate 38. Additionally, by opening the valve V0 with the valve V2 closed, the back surface of the substrate held to the substrate holding head 21 can be vacuumized, and the vacuum suction of the substrate W to the substrate holding head 21 can be performed.

Figure 12:
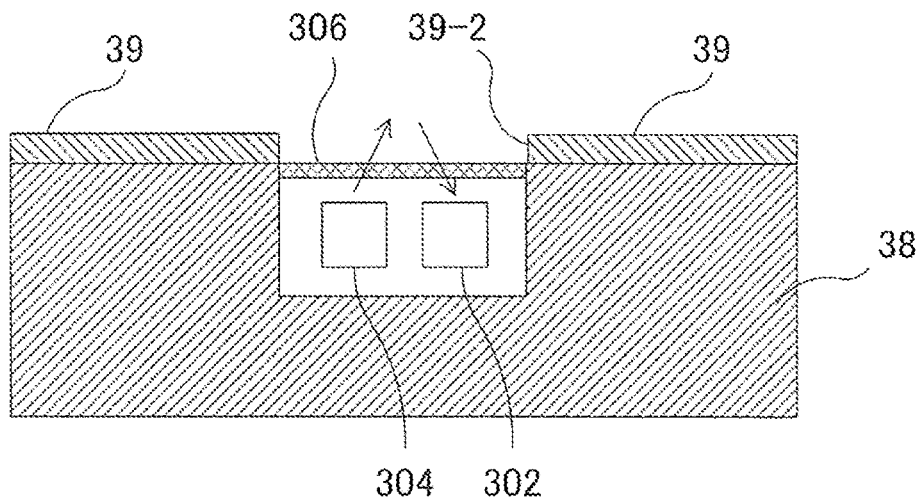
FIG. 12 is a cross-sectional view schematically illustrating an optical end point detection mechanism according to one embodiment.

In the CMP apparatus 300 illustrated in FIG. 11, the polishing plate 38 can include a sensor to sense the end point of the polishing of the substrate. FIG. 12 is a cross-sectional view schematically illustrating the optical end point detection mechanism according to one embodiment. FIG. 12 illustrates a part of the polishing plate 38 where the sensor 304 is disposed. The sensor 304 illustrated in FIG. 12 is an optical sensor, and the light source 302 is further disposed in the polishing plate 38. The sensor 304 and the light source 302 are configured to perform wired or wireless communications with the control device 900 (FIG. 11). In the embodiment illustrated in FIG. 12, a cutout 39-2 is provided in a part of the polishing cloth 39. A view port 306 is disposed at a position of the cutout 39-2. The light source 302 irradiates the substrate during polishing with light via the view port 306, and the sensor 304 can sense the reflected light from the substrate. The end point of the polishing of the substrate can be sensed from a change in reflectance of the substrate during polishing and the like. As one embodiment, the sensor 304 can be one including a spectroscope, such as Fabry-Perot spectroscope. Additionally, with the use of a fiber sensor as the sensor 304, a plurality of the sensors 304 and the light sources 302 may be disposed in the polishing plate 38. For example, the sensors 304 and the light sources 302 may be disposed at the center and the peripheral portion of the polishing plate 38, and the end point of the polishing of the substrate W may be determined by monitoring signals from both of the sensors 304 and the light sources 302. The use of the plurality of sensors 304 and light sources 302 ensures monitoring a film thickness at a plurality of areas of the polished surface of the substrate W. Polishing conditions can be regulated based on the signals from the plurality of sensors 304 such that end points of polishing of the plurality of areas of the substrate W become the same timing.

The CMP apparatus 300 illustrated in FIG. 11 and an end point sensing sensor illustrated in FIG. 12 can be used for the above-described methods for polishing the substrate and methods for sensing the end point of substrate polishing. Additionally, the CMP apparatus 300 illustrated in FIG. 11 and the end point sensing sensor illustrated in FIG. 12 can be used for a method for sensing an end point of substrate polishing by another method. The following describes some methods for sensing the end point of substrate polishing.

Figure 13:
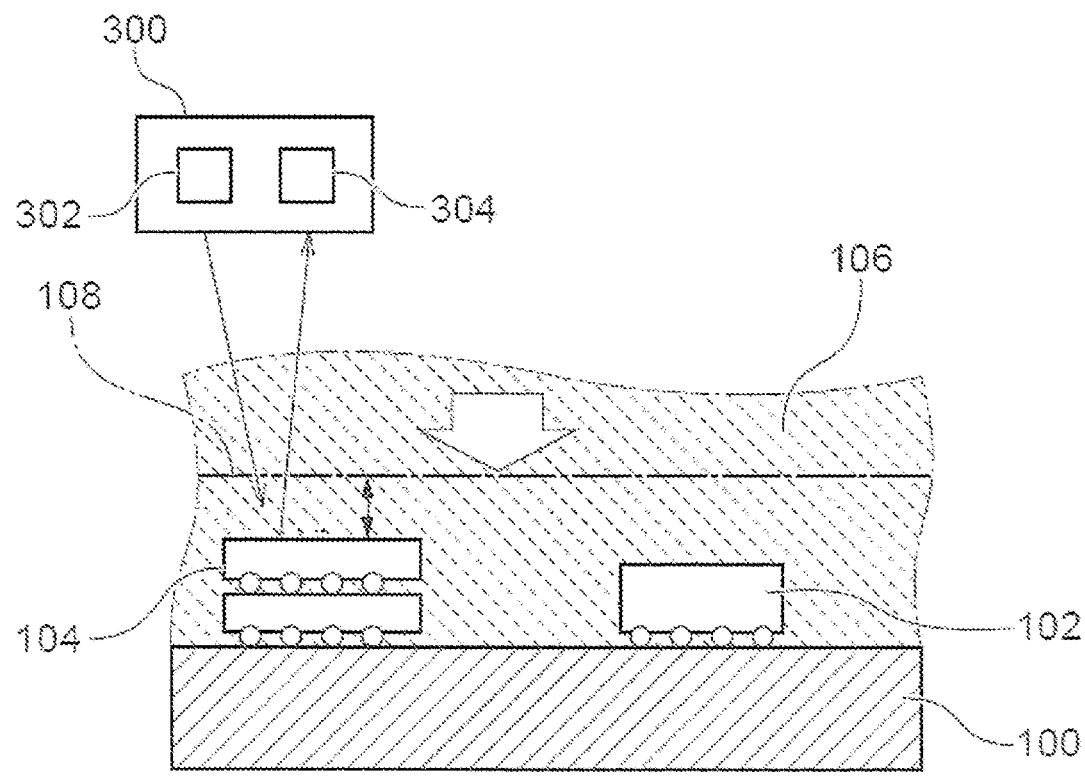
FIG. 13 is a drawing describing the method for polishing the substrate according to one embodiment.

FIG. 13 is a drawing describing the method for polishing the substrate according to one embodiment. In the embodiment illustrated in FIG. 13, in the substrate, the logic chip 102, such as a CPU and a GPU, and/or the memory chip 104, and the like are disposed on the Copper Clad Laminate (CCL) base 100. Different from the substrate illustrated in FIG. 1, the end point sensing element 200, such as the reflective film 202, is not disposed on the substrate illustrated in FIG. 13. In the embodiment illustrated in FIG. 13, after the functional chips 102 and 104 are disposed on the CCL base 100, the CCL base 100 on which the functional chips 102 and 104 are mounted is sealed with the insulating material 106. The insulating material 106 can be, for example, resin and a glass material. After the sealing with the insulating material 106, the insulating material 106 is polished such that the insulating material 106 becomes flat. The polishing of the insulating material 106 can be chemomechanically polished (CMP). For example, the polishing can be performed using the CMP apparatus 300 including the optical end point sensing sensor illustrated in FIG. 12. In the embodiment of FIG. 13, the light source 302 irradiates the surface of the chip at the highest position among the functional chips 102 and 104 with light, and the sensor 304 receives the reflected light. In the embodiment illustrated in FIG. 13, the reflected light can be dispersed to measure the thickness of the insulating material 106 from a relative reflectance of each wavelength of the reflected light. The light irradiated from the light source 302 to the insulating material 106 on the substrate is reflected by the surface of the insulating material 106 and also reflected by the surface of the functional chip at the highest position (the memory chip 104 in the example of FIG. 13). An interference of the lights reflected at the different positions changes the relative reflectance of each wavelength of the lights detected by the sensor 304 according to the thickness of the insulating material 106. Therefore, the detection of the relative reflectance allows measuring the thickness of the insulating material 106 on the functional chip 102 or 104. By preliminarily measuring the relative reflectance when the thickness of the insulating material 106 reaches the polishing target position 108 by preliminary experiment, the light source 302 and the sensor 304 illustrated in FIG. 12 can be used as the end point sensing sensors of the substrate during polishing. When the thickness of the insulating material 106 reaches the polishing target position 108, the polishing is terminated. The end point position of the insulating material 106 is preferably, for example, ±10 µm or less from the polishing target position 108. The polishing target position 108 can be set to, for example, 10 µm to 500 µm from the top surface of the chip 104 at the uppermost position. As the spectroscope, a Fabry-Perot spectroscope or the like can be used. Any light source, such as a laser diode and an LED, can be used as the light source 302. The wavelength range of the light source 302 can include, for example, 500 nm to 800 nm. As the wavelength of the light source 302, a wavelength range from 200 nm to 500 nm, which is a short wavelength, can also be used according to the film thickness and a film type of the insulating material 106, the target for irradiation, and the like.

Regarding FIG. 13, while the above-described method senses the end point of substrate polishing from the change in relative reflectance of the reflected light, the measurement of the intensity of the light also allows sensing the end point of substrate polishing. In such a method, the light source 302 irradiates the functional chip 102 or 104 at the highest position on the substrate with light and the sensor 304 senses the reflected light. The intensity of the reflected light changes depending on the thickness of the insulating material 106 disposed on the functional chip 102 or 104. Accordingly, by preliminarily measuring the intensity of the reflected light when the thickness of the insulating material 106 reaches the polishing target position 108 by preliminary experiment, the light source 302 and the sensor 304 illustrated in FIG. 12 can be used as the end point sensing sensors of the substrate during polishing. When the intensity of the reflected light is measured to sense the end point of substrate polishing, a spectroscope is unnecessary different from the case where the above-described relative reflectance is measured for end point sensing. In this case, an integration of all wavelength components is measured as the intensity of the reflected light. Note that the intensity of the reflected light at a specific wavelength (for example, any wavelength of 500 nm or less) may be measured using a spectroscope. In the measurement of the intensity of the reflected light, any light source, such as a laser diode and an LED, can be used as the light source 302. Note that the light source 302 preferably includes a wavelength range (for example, a wavelength of 500 nm or less) where the reflectance at the surface (for example, silicon) of the functional chip 102 or 104 is high. Additionally, as the light source 302, a monochromatic light source at a specific wavelength (for example, any wavelength of 500 nm or less) may be used.

In the method for polishing the substrate illustrated in FIG. 13, infrared light (for example, the wavelength of 1 µm to 3 µm) can be used as the light source 302 and the thickness of the insulating material 106 and the end point of polishing can be sensed using an infrared spectroscope. A reflectance of the infrared light at the surface of the functional chip 102 or 104 is different from a reflectance of the infrared light at the surface of the insulating material 106 (for example, resin). Therefore, depending on the thickness of the insulating material 106 formed on the functional chip 102 or 104, spectral intensity of the reflected light received by the sensor 304 changes. Thus, the thickness of the insulating material 106 can be detected by the spectrum change of the reflected light.

Figure 14:
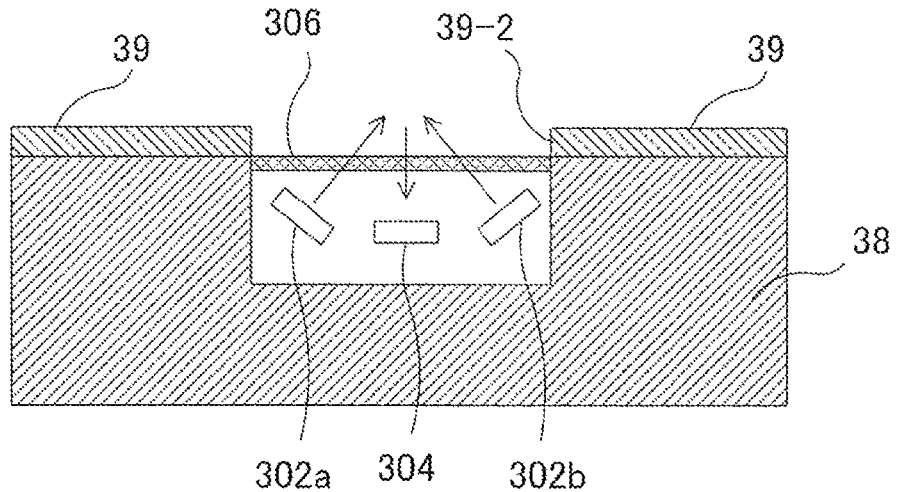
FIG. 14 is a cross-sectional view schematically illustrating the optical end point detection mechanism according to one embodiment.

FIG. 14 is a cross-sectional view schematically illustrating the optical end point detection mechanism according to one embodiment. FIG. 14 illustrates a part of the polishing plate 38 where the sensor 304 is disposed. The end point detection mechanism illustrated in FIG. 14 includes two light sources 302a and 302b. The respective light sources 302a and 302b are positioned so as to irradiate the surface of the substrate (not illustrated) during polishing with light. The sensor 304 is positioned so as to receive scattered light of the light irradiated to the substrate. The end point detection mechanism according to the embodiment illustrated in FIG. 14 may include a spectroscope. The sensor 304 and the light source 302 are configured to perform wired or wireless communications with the control device 900 (FIG. 11). In the embodiment illustrated in FIG. 14, the cutout 39-2 is provided in a part of the polishing cloth 39. The view port 306 is disposed at a position of the cutout 39-2. In the embodiment illustrated in FIG. 14, the light source 302 irradiates the substrate during polishing with light via the view port 306, and the sensor 304 can sense the scattered light from the substrate. In the embodiment illustrated in FIG. 14, the view port 306 may be absent. In such a case, the detection can be performed while pure water is supplied to a depressed portion of the polishing plate 38 where the light sources 302a and 302b and the sensor 304 are disposed. The end point detection mechanism according to the embodiment illustrated in FIG. 14 can be used for the above-described polishing methods and end point sensing.

Figure 15:
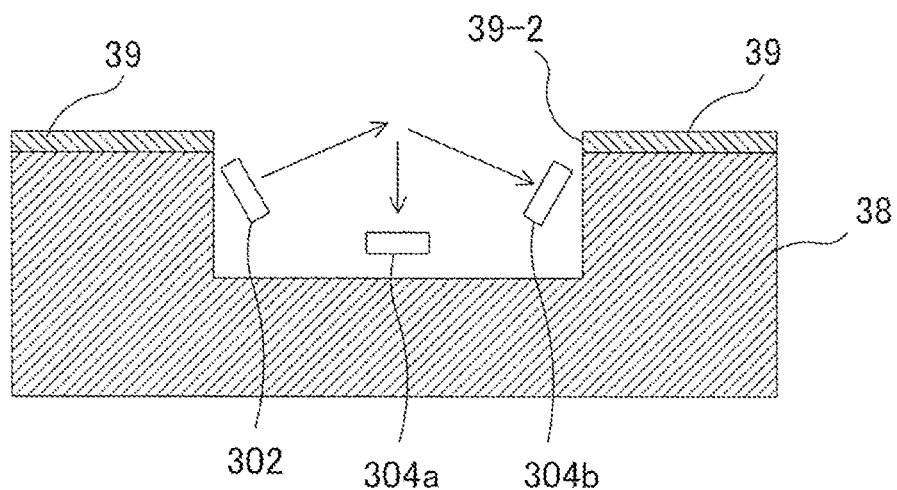
FIG. 15 is a cross-sectional view schematically illustrating the optical end point detection mechanism according to one embodiment.

FIG. 15 is a cross-sectional view schematically illustrating the optical end point detection mechanism according to one embodiment. FIG. 15 illustrates a part of the polishing plate 38 where the sensor 304 is disposed. The end point detection mechanism illustrated in FIG. 15 includes the one light source 302, a first sensor 304a, and a second sensor 304b. The light source 302 is positioned so as to irradiate the substrate with light at an angle at which the light is totally reflected by the surface of the substrate. Additionally, the second sensor 304b is positioned so as to receive the totally reflected light. The first sensor 304a is positioned so as to receive the scattered light on the surface of the substrate. In the embodiment of FIG. 15, the light source 302 and the second sensor 304b can include driving mechanisms (not illustrated) configured to adjust an incidence angle of light to the surface of the substrate. The end point detection mechanism using the total reflection illustrated in FIG. 15 is usable when the material changes at the target polishing position. For example, as described in FIG. 4 and FIG. 8, the end point detection mechanism is usable to remove the metal layer 114 stacked on the insulating material 106. A total reflection angle at the metal layer 114 and a total reflection angle when the metal layer 114 is removed and the insulating material 106 disposed below the metal layer 114 is exposed are different. This allows a detection of the removal of the metal layer 114 from the change in light intensity of the received light. In this case, the totally reflected light may be measured by the second sensor 304b, or the scattered light may be measured by the first sensor 304a, or both may be measured. Note that in the embodiment illustrated in FIG. 15, the view port 306 as illustrated in FIG. 14 does not exist. This is because of preventing the total reflection of light by the surface of the view port 306. Additionally, in the embodiment illustrated in FIG. 15, since the view port 306 is not used, the detection can be performed while pure water is supplied to the depressed portion of the polishing plate 38 where the light source 302 and the sensors 304a and 304b are disposed.

Note that as a total reflection condition, a relationship between a refractive index A of a medium in contact with the surface of the target for polishing, such as water or pure water, and a refractive index B of the surface of the substrate, such as the insulating material 106, needs to meet: refractive index A>refractive index B.

Figure 16:
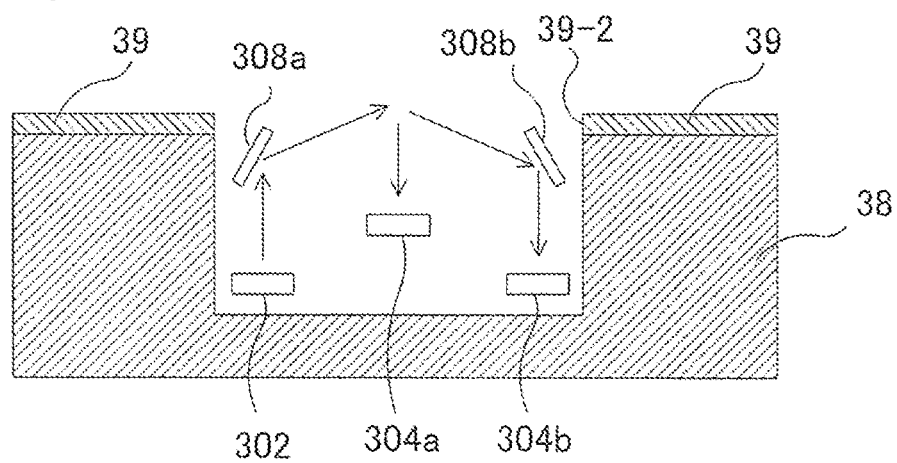
FIG. 16 is a cross-sectional view schematically illustrating the optical end point detection mechanism according to one embodiment.

FIG. 16 is a cross-sectional view schematically illustrating the optical end point detection mechanism according to one embodiment. FIG. 16 illustrates a part of the polishing plate 38 where the sensor 304 is disposed. The end point detection mechanism illustrated in FIG. 16 uses the total reflection similar to the embodiment illustrated in FIG. 15. In the embodiment illustrated in FIG. 16, the light irradiated from the light source 302 is reflected by a first mirror 308a and guided to the surface of the substrate. The first mirror 308a is positioned so as to orient the light to the substrate at an angle at which the light is totally reflected by the surface of the substrate. The end point detection mechanism illustrated in FIG. 16 includes a second mirror 308b. The second mirror 308b is positioned so as to guide the light totally reflected by the surface of the substrate during polishing to the second sensor 304b. The first mirror 308a and the second mirror 308b can include driving mechanisms (not illustrated) configured to adjust an incidence angle of light to the surface of the substrate. Other configurations of the end point detection mechanism of FIG. 16 can be configured similarly to the end point detection mechanism illustrated in FIG. 15. The end point detection mechanism using the total reflection illustrated in FIG. 16 is usable when the material changes at the target polishing position, similarly to the end point detection mechanism illustrated in FIG. 15.

Figure 17A:
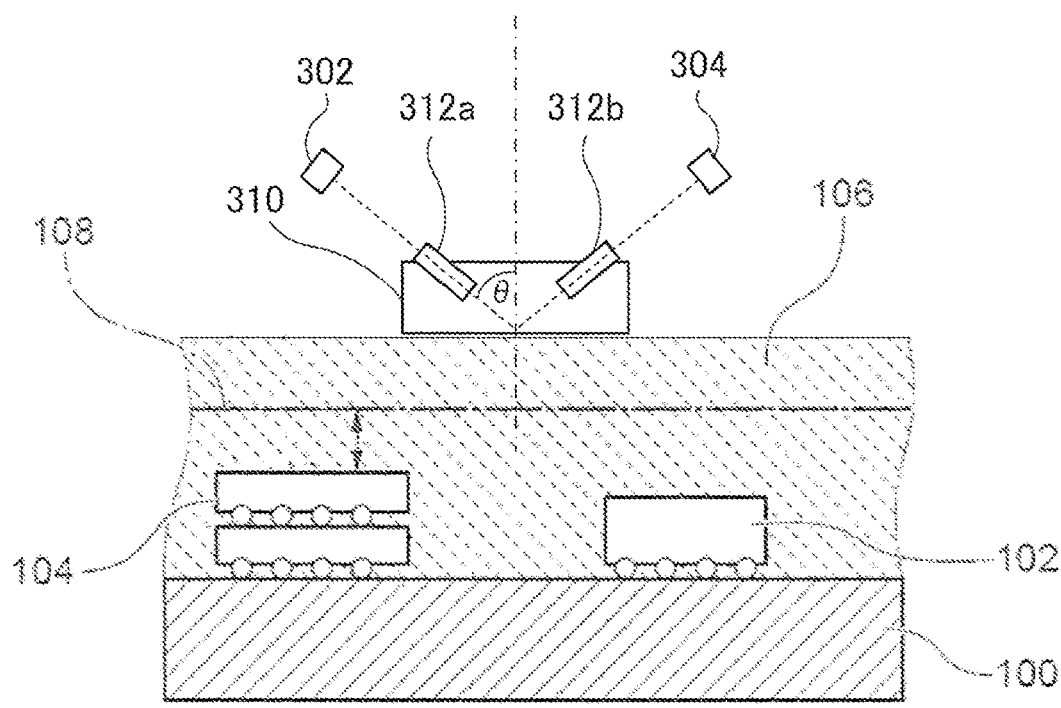
FIG. 17A is a cross-sectional view schematically illustrating the optical end point detection mechanism according to one embodiment.

FIG. 17A is a cross-sectional view schematically illustrating the optical end point detection mechanism according to one embodiment. Although FIG. 17A illustrates a part of the polishing plate 38 where the sensor 304 is disposed, for clarification, the polishing plate 38 and the polishing cloth 39 are not illustrated. The end point detection mechanism illustrated in FIG. 17A, similarly to the other optical end point detection mechanisms, includes the light source 302 and the sensor 304. The end point detection mechanism illustrated in FIG. 17A further includes an adapter 310. The adapter 310 can be made of a high refractive index material, such as an optical plastic. A refractive index of the adapter 310 is preferably larger than the refractive index of the insulating material 106 on the surface of the substrate as the target for polishing. The adapter 310 can be formed into a block having an approximately rectangular parallelepiped shape. The adapter 310 can be disposed so as to be in contact with or close to the surface of the substrate as the target for polishing. The adapter 310 includes a first optical fiber 312a and a second optical fiber 312b. The first optical fiber 312a and the light source 302 are disposed such that the first optical fiber 312a receives the light from the light source 302. The second optical fiber 312b is disposed so as to receive the light left from the first optical fiber 312a and reflected by a boundary between the adapter 310 and the surface of the substrate. The second optical fiber 312b and the sensor 304 are disposed such that the sensor 304 receives the light left from the second optical fiber 312b. The first optical fiber 312a and the second optical fiber 312b may be configured as optical fibers having identical apertures or may be configured as optical fibers having different apertures. For example, to increase a yield, the second optical fiber 312b may be configured as an optical fiber having the aperture larger than that of the first optical fiber 312a. Additionally, instead of the second optical fiber 312b, an array type optical sensor (for example, a photodiode array) may be built into the adapter 310. The light source 302, the sensor 304, and the adapter 310 are configured to be movable in a direction perpendicular to the surface of the substrate while holding the relative positions. For example, these units are mounted to the polishing plate 38 with a moving mechanism (not illustrated).

Figure 17B:
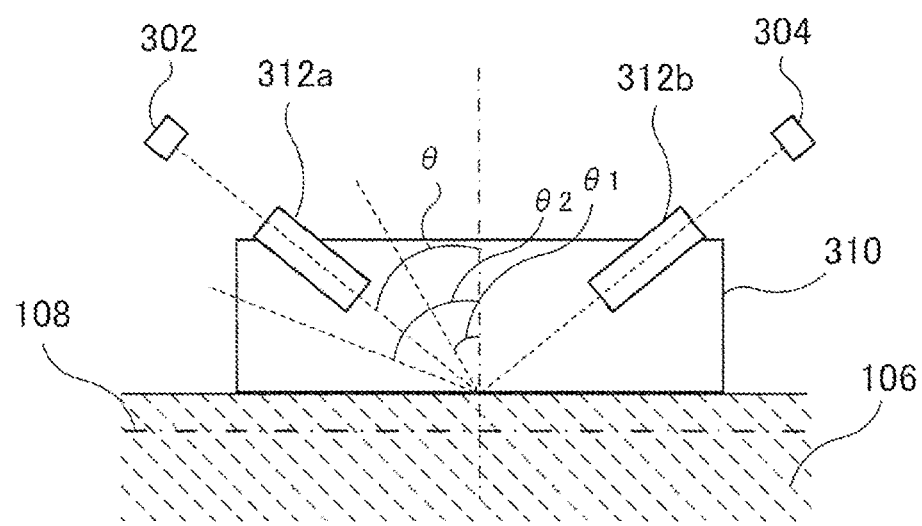
FIG. 17B is a drawing of enlarging a part near an adapter of the optical end point detection mechanism illustrated in FIG. 17A.

FIG. 17B is a drawing of enlarging a part near the adapter 310 of the optical end point detection mechanism illustrated in FIG. 17A. As illustrated in FIG. 17B, the first optical fiber 312a is disposed such that the light left from the first optical fiber 312a enters a boundary surface of the adapter 310 at an incident angle θ. The incident angle θ is set to be larger than a critical angle θ1 determined by the refractive index of the adapter 310 and a refractive index of water or pure water, and smaller than a critical angle θ2 determined by the refractive index of the adapter 310 and a refractive index of a material of the surface of the substrate (for example, the insulating material 106) as the target for polishing.

The end point of substrate polishing can be detected using the optical end point detection mechanism illustrated in FIG. 17A as follows. As one example, as illustrated in FIG. 17A, in the substrate as the target for polishing, the logic chip 102, such as a CPU and a GPU, and/or the functional chip, such as the memory chip 104, are disposed on the Copper Clad Laminate (CCL) base 100. The CCL base 100 on which these functional chips 102 and 104 are disposed is sealed with the insulating material 106. The insulating material 106 can be, for example, resin and a glass material. The following describes a method for polishing the insulating material 106 up to the polishing target position 108 using the end point detection mechanism illustrated in FIG. 17A.

First, the adapter 310 is moved in the direction of the substrate until in contact with the surface of the substrate. When the adapter 310 contacts the substrate, a position of the adapter 310 in a direction perpendicular to the surface of the substrate is fixed. The surface of the substrate is roughly polished in this state, thus flattening the surface of the substrate. After the surface of the substrate is flattened, the adapter 310 is moved toward the substrate again such that the adapter 310 is in close contact with the flattened surface of the substrate. An amount of polishing by the rough polishing can be calculated from the moving distance of the adapter 310. Alternatively, a distance between the position of the adapter 310 and the flattened surface of the substrate at the start of rough polishing may be measured by another method to calculate the amount of polishing of the rough polishing.

Figure 17C:
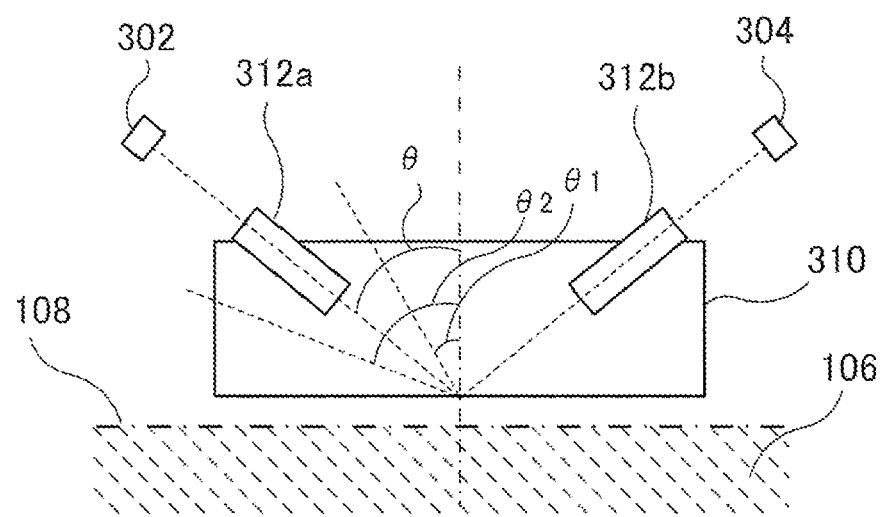
FIG. 17C is a drawing of enlarging a part near the adapter of the optical end point detection mechanism illustrated in FIG. 17A.

Next, when the adapter 310 is brought into close contact with the flattened surface of the substrate, the position of the adapter 310 in the direction perpendicular to the surface of the substrate is fixed. FIGS. 17A and 17B illustrate the state. Polishing is additionally performed in this state. At this time, the light source 302 irradiates the surface of the substrate with light through the first optical fiber 312a. The detection of the reflected light passing through the second optical fiber 312b by the sensor 304 ensures measuring the amount of polishing of the substrate. As illustrated in FIG. 17B, in a state of starting polishing, the adapter 310 is in contact with the insulating material 106 on the surface of the substrate. As described above, the light enters the insulating material 106 from the adapter 310 at the incident angle θ. As described above, the incident angle θ is smaller than the critical angle θ2, which is determined by the refractive index of the adapter 310 and the refractive index of the insulating material 106; therefore, the light is not totally reflected by the surface of the insulating material 106. As the polishing proceeds, as illustrated in FIG. 17C, a clearance is generated between the insulating material 106 on the surface of the substrate and the adapter 310. As the polishing proceeds, polishing liquid and pure water enter this clearance. As described above, the incident angle θ of the light is larger than the critical angle θ1, which is determined by the refractive index of the adapter 310 and the refractive index of water or pure water; therefore, the light is totally reflected by the boundary between the adapter 310 and the pure water. Accordingly, as the polishing proceeds, the intensity of the reflected light detected by the sensor 304 increases. By preliminarily calibrating a relationship between the amount of polishing and the intensity of the reflected light when the reflection transitions from partial reflection to the total reflection, the amount of polishing can be determined from the change in intensity of the reflected light detected by the sensor 304. Thus, the insulating material 106 can be polished up to the polishing target position 108. Note that the above-described end point detection of polishing is similarly applicable also to a case where the target for polishing is a semiconductor material, such as Si and $SiO_2$, in addition to the insulating material 106 described above.

The embodiments of the present invention have been described above based on some examples in order to facilitate understanding of the present invention without limiting the present invention. The present invention can be changed or improved without departing from the gist thereof, and of course, the equivalents of the present invention are included in the present invention. It is possible to arbitrarily combine or omit respective components according to claims and description in a range in which at least a part of the above-described problems can be solved, or a range in which at least a part of the effects can be exhibited.

REFERENCE SIGNS LIST

100 CCL base
102 logic chip
104 memory chip
106 insulating material
108 polishing target position
114 metal layer
116 barrier mold layer
118 interconnection chip
200 end point sensing element
202 reflective film
204 reflective plate
206 dummy element

The invention claimed is:

1. A method for chemomechanically polishing a substrate including a functional chip, the method comprising:
   a step of disposing the functional chip on the substrate;
   a step of disposing an end point sensing element on the substrate;
   a step of sealing the substrate on which the functional chip and the end point sensing element are disposed with an insulating material;
   a step of forming a barrier mold layer on the insulating material; and
   a step of forming a metal layer on the barrier mold layer;
   a step of polishing the insulating material; and
   a step of sensing an end point of the polishing based on the end point sensing element while the insulating material is polished,
   when the metal layer is polished, the end point of the polishing is sensed based on at least one of:
   (1) a change in eddy current by an eddy current sensor;
   (2) a change in reflected light from the metal layer by an optical sensor; and
   (3) a change in polishing resistance.

2. The method according to claim 1, wherein
   the end point sensing element includes a reflection element, and
   the method comprises:
   a step of irradiating the reflection element with light; and
   a step of receiving light reflected by the reflection element.

3. The method according to claim 1, comprising
   a step of fixing the end point sensing element to a top surface of the functional chip with an adhesive.

4. The method according to claim 1, wherein
   the end point sensing element includes a dummy element unrelated to a function configured on the substrate.

5. The method according to claim 1, comprising:
   a step of performing a process for wiring on the insulating material after the insulating material is polished; and
   a step of performing a surface treatment to improve hydrophilicity on a processed surface of the insulating material.

6. A method for chemomechanically polishing a substrate including a functional chip, wherein
   the functional chip and an end point sensing element are disposed on the substrate, and the substrate is in a state of sealed with an insulating material, and
   the substrate is in a state where a barrier mold layer is formed on the insulating material and further a metal layer is formed on the barrier mold layer, the method comprises:
- a step of polishing the insulating material; and
- a step of sensing an end point of the polishing based on the end point sensing element while the insulating material is polished,
- when the metal layer is polished, the end point of the polishing is sensed based on at least one of:
  - (1) a change in eddy current by an eddy current sensor;
  - (2) a change in reflected light from the metal layer by an optical sensor; and
  - (3) a change in polishing resistance.

7. The method according to claim 6, wherein
the end point sensing element includes a reflection element, and
the method comprises:
- a step of irradiating the reflection element with light; and
- a step of receiving light reflected by the reflection element.

8. The method according to claim 6, wherein
the end point sensing element is fixed to a top surface of the functional chip with an adhesive.

9. The method according to claim 6, wherein
the end point sensing element includes a dummy element unrelated to a function configured on the substrate.

10. A method for chemomechanically polishing a substrate including a functional chip sealed with an insulating material, the method comprising:
- a step of irradiating the substrate with light such that the light is totally reflected by a surface of the substrate;
- a step of receiving light totally reflected by the surface of the substrate; and
- a step of determining an end point of the polishing of the substrate based on a change in the received light.

11. A computer-readable recording medium that records a program, when the program is executed by a control device to control an operation of a substrate polishing apparatus, the program causing the control device to control the substrate polishing apparatus and to execute the method according to claim 1.

* * * * *